(12) United States Patent
Humele et al.

(10) Patent No.: US 8,435,350 B2
(45) Date of Patent: May 7, 2013

(54) SUPPLY DEVICE

(75) Inventors: Heinz Humele, Thalmassing (DE);
Andreas Kursawe, Kirchroth (DE);
Andreas Kraus, Regensburg (DE);
Jochen Krueger, Thalmassing (DE);
John Felts, Alameda, CA (US)

(73) Assignee: Krones AG, Neutraubling (DE)

( * ) Notice: Subject to any disclaimer, the term of this patent is extended or adjusted under 35 U.S.C. 154(b) by 903 days.

(21) Appl. No.: 12/534,237

(22) Filed: Aug. 3, 2009

(65) Prior Publication Data

US 2010/0031887 A1 Feb. 11, 2010

(30) Foreign Application Priority Data

Aug. 8, 2008 (DE) .................. 10 2008 037 160

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl.
USPC ........... 118/719; 118/729; 118/730; 118/724; 156/345.22

(58) Field of Classification Search .................. 118/719, 118/729, 730, 724; 156/345.22
See application file for complete search history.

(56) References Cited

U.S. PATENT DOCUMENTS

| | | | |
|---|---|---|---|
| 5,069,930 A | 12/1991 | Hussla et al. | |
| 5,308,649 A * | 5/1994 | Babacz | 427/562 |
| 5,683,517 A | 11/1997 | Shan | |
| 6,112,695 A | 9/2000 | Felts | |
| 6,180,191 B1 | 1/2001 | Felts | |
| 6,279,505 B1 * | 8/2001 | Plester et al. | 118/723 VE |
| 7,854,805 B2 * | 12/2010 | Kraus et al. | 118/719 |
| 2002/0170598 A1 | 11/2002 | Girard et al. | |
| 2003/0003696 A1 | 1/2003 | Gelatos et al. | |
| 2003/0077400 A1 * | 4/2003 | Plester et al. | 427/566 |
| 2004/0041286 A1 | 3/2004 | Lee et al. | |
| 2005/0233077 A1 * | 10/2005 | Lizenberg et al. | 427/248.1 |
| 2008/0032059 A1 * | 2/2008 | Zimmerer et al. | 427/458 |
| 2009/0081382 A1 * | 3/2009 | Kraus et al. | 427/569 |
| 2010/0031887 A1 * | 2/2010 | Humele et al. | 118/724 |
| 2010/0034985 A1 * | 2/2010 | Krueger et al. | 427/579 |

FOREIGN PATENT DOCUMENTS

| | | |
|---|---|---|
| DE | 10031921 | 1/2002 |
| EP | 0361171 A1 | 4/1990 |
| JP | 63199432 | 8/1988 |
| JP | 11323558 A | 11/1999 |
| WO | WO-9002217 | 3/1990 |
| WO | WO-93/24243 A1 | 12/1993 |

OTHER PUBLICATIONS

European Search Report for 09009166.1-2122 dated Oct. 26, 2009.

* cited by examiner

*Primary Examiner* — Rudy Zervigon
(74) *Attorney, Agent, or Firm* — Marshall, Gerstein & Borun LLP

(57) ABSTRACT

A device for supplying a large number of consumer stations with a predetermined amount of a process medium, in particular a coating device for containers, has a supply line for the process medium and a connection at the consumer station. In order to make such a device simpler from the structural point of view and less expensive, a unit is used, which keeps a predetermined flow rate constant and which comprises a capillary path extending before each connection and dimensioned in accordance with the predetermined amount of process medium, and a unit which is associated with a plurality of connections and which is used for maintaining a defined flow velocity along the capillary path.

11 Claims, 3 Drawing Sheets

SUPPLY DEVICE

CROSS-REFERENCE TO RELATED APPLICATION

The present application claims the benefit of priority of German Patent Application No. 102008037160.2, filed Aug. 8, 2008. The entire text of the priority application is incorporated herein by reference in its entirety.

FIELD OF THE DISCLOSURE

The present disclosure relates to a device for supplying a large number of consumer stations with a predetermined amount of a process medium, in particular a coating device for containers.

BACKGROUND

Such a device is known from US 2005/0233077. The known device is used for coating inner surfaces of containers, in particular bottles for holding beverages. The device is integrated in a carousel guiding the containers along a process path whose length is adapted to the necessary processing time, in this case coating time. The process medium or the process media required for treating the container is/are supplied via valves. Each consumer station and each process medium requires a valve of its own. In order to reduce the number of valves, it has already been suggested in this reference that, in each consumer station, two containers should be connected to the junction for a process medium, so that only half the number of valves will be required. Nevertheless, a large number of valves is still necessary, which render the system very expensive.

SUMMARY OF THE DISCLOSURE

It is the object of the present disclosure to provide a structurally simple, reasonably priced device for supplying a large number of consumer stations with a predetermined amount of a process medium.

On the basis of the embodiment according to the present disclosure, the use of valves can possibly be dispensed with completely, or only one single process medium valve will be necessary. In this way, the device according to the present disclosure will become much simpler from the structural point of view and its production costs will be reduced substantially.

The fact that the capillary path is implemented as a plastic tube simplifies production still further, since appropriate dimensions of plastic tubes can easily be established.

In order to maintain defined flow conditions, the temperature of the process medium flowing through the capillary path should be kept constant in a reproducible manner, and this is preferably accomplished by a heat store in which the capillary path is accommodated. In addition, a heating unit can be provided.

Defined flow conditions can also be maintained in that the capillary path is connected to a pressure chamber, which acts as a buffer.

When the pressure difference is kept constant in a self-regulating manner, the device will be simplified still further.

On the basis of the embodiment according to the present disclosure, all consumer stations can be supplied with process medium. It will suffice to provide one capillary path for each consumer station and each process medium.

Another very important advantage of using a capillary path is to be seen in that in cases where process media are provided in a liquid state, but are required in a gaseous state, the capillary path acts, at the point where it terminates into the vacuum, as an evaporator which converts a process medium supplied as a liquid into the gaseous state without any necessity of taking special measures.

BRIEF DESCRIPTION OF THE DRAWINGS

In the following, an embodiment of the present disclosure will be explained in more detail on the basis of the drawings, in which.

DETAILED DESCRIPTION OF THE PREFERRED EMBODIMENT

Figure 1:
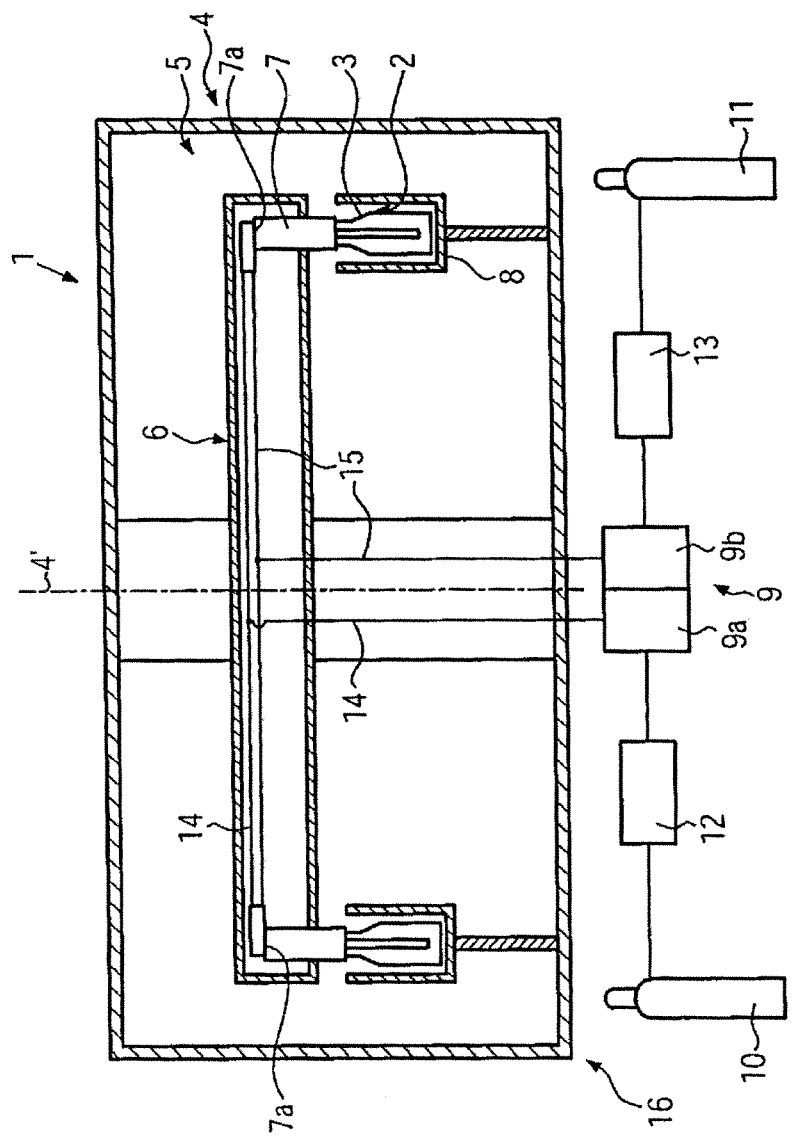
FIG. 1 shows a cross-section through a device according to the present disclosure in a highly schematic representation.

FIG. 1 shows a highly schematic representation of a device 1 for supplying a large number of consumer stations 2 with a predetermined amount of a process medium. In the embodiment shown, the device 1 is implemented as a plasma coating system that serves to provide containers 3 which are arranged in the consumer station 2 with a coating that improves the gas tightness, the UV resistance, the UV shielding effect or the like, the containers shown in FIG. 1 being plastic bottles. In the embodiment shown, this coating is applied to the inner side of the containers 3.

The device 1 comprises a carousel 4, i.e. a device conveying the containers 3 about an axis 4' from a pick-up station (not shown) to a delivery station (not shown) along an intermediate treatment path. The carousel 4 comprises a first pressure chamber 5 by means of which the outer side of the container 3 is acted upon, and a second pressure chamber 6 which communicates with the inner side of the container 3 and which is arranged in the first pressure chamber 5. The pressure chambers 5 and 6 are maintained at different pressures, and they are both configured as vacuum chambers. For coating inner surfaces, the second pressure chamber 6 is maintained at a pressure at which a plasma can easily ignite (normally <1 mbar), whereas a higher or a lower pressure, at which the plasma cannot ignite, prevails in pressure chamber 5.

Each consumer station 2 is provided with a gas pressure valve 7. In addition, each consumer station 2 is provided with a holder for the containers 3 by means of which the opening of the containers 3 can be pressed against the valve 7. This movement for closing the opening of the container 3 though the valve 7 is preferably executed via a cam follower or the like, which lifts the container 3 and presses it against the valve located above the container. Each consumer station 2 additionally comprises an electrode 8, which may e.g. be annular in shape or U-shaped.

Although in the depicted embodiment only two consumer stations 2 are shown, it is clearly evident that a large number of consumer stations 2 can be distributed around the axis 4'. In addition, each consumer station 2 can accommodate more than one container 3.

The process medium or the process media required for plasma coating are fed to the carousel 4 through a rotary feedthrough 9, preferably in the area of the axis of rotation 4'. The rotary feedthrough 9 is supplied by one or by a plurality of supply sources 10, 11. For providing a coating of silicon oxide, these supply sources are, in the embodiment shown, a first reservoir 10 for a gaseous process medium, in particular oxygen, and a second reservoir 11 for a liquid process medium, e.g. a liquid monomer, such as hexamethyldisiloxane (HMDSO) or some other silane.

Each of these reservoirs 10, 11 is connected via a respective valve 12, 13 to a pressure chamber 9a and 9b, respectively, provided in the rotary feedthrough 9. The valves 12, 13 may be configured e.g. as mass flow controllers. The mass flow controllers are preferably adjusted such that a constant media flow takes place.

Figure 2:
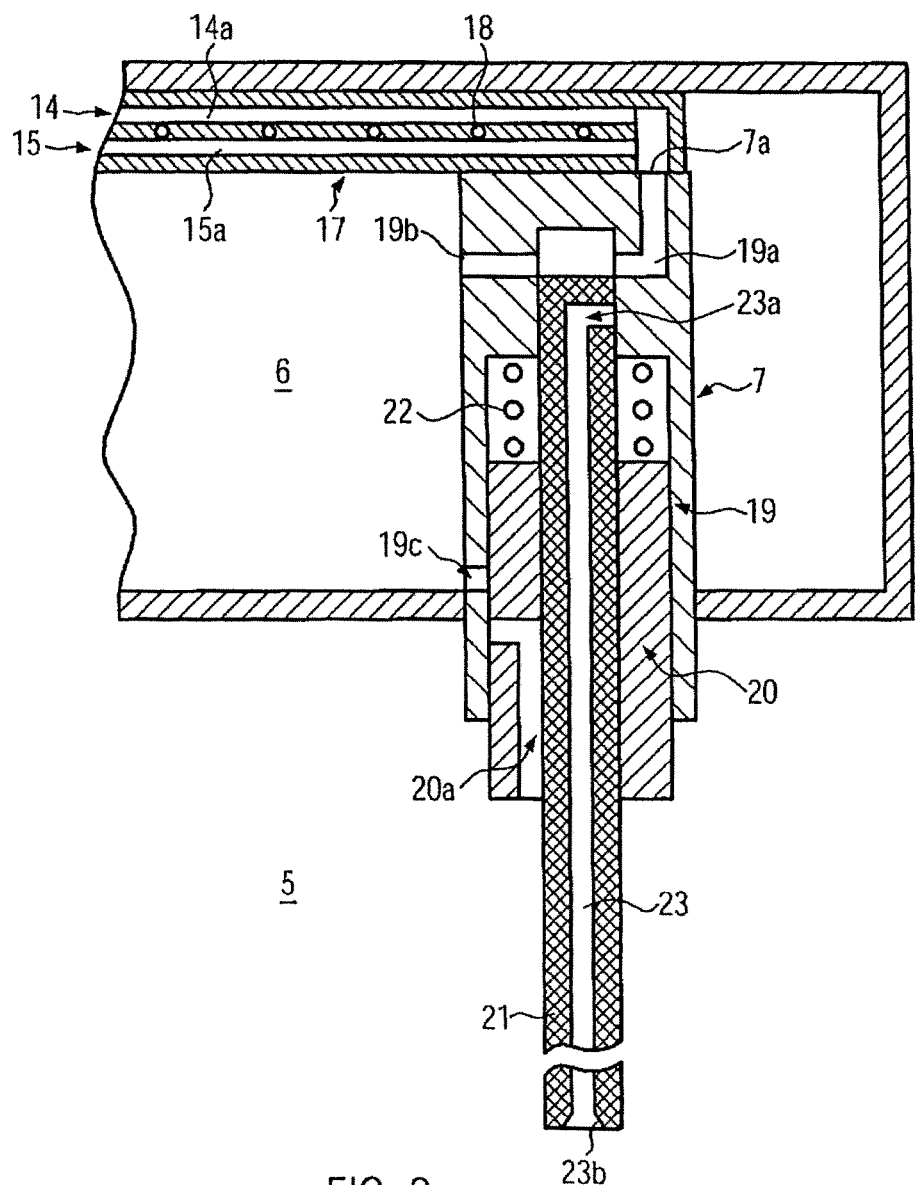
FIG. 2 shows a consumer station in its closed condition.
Figure 3:
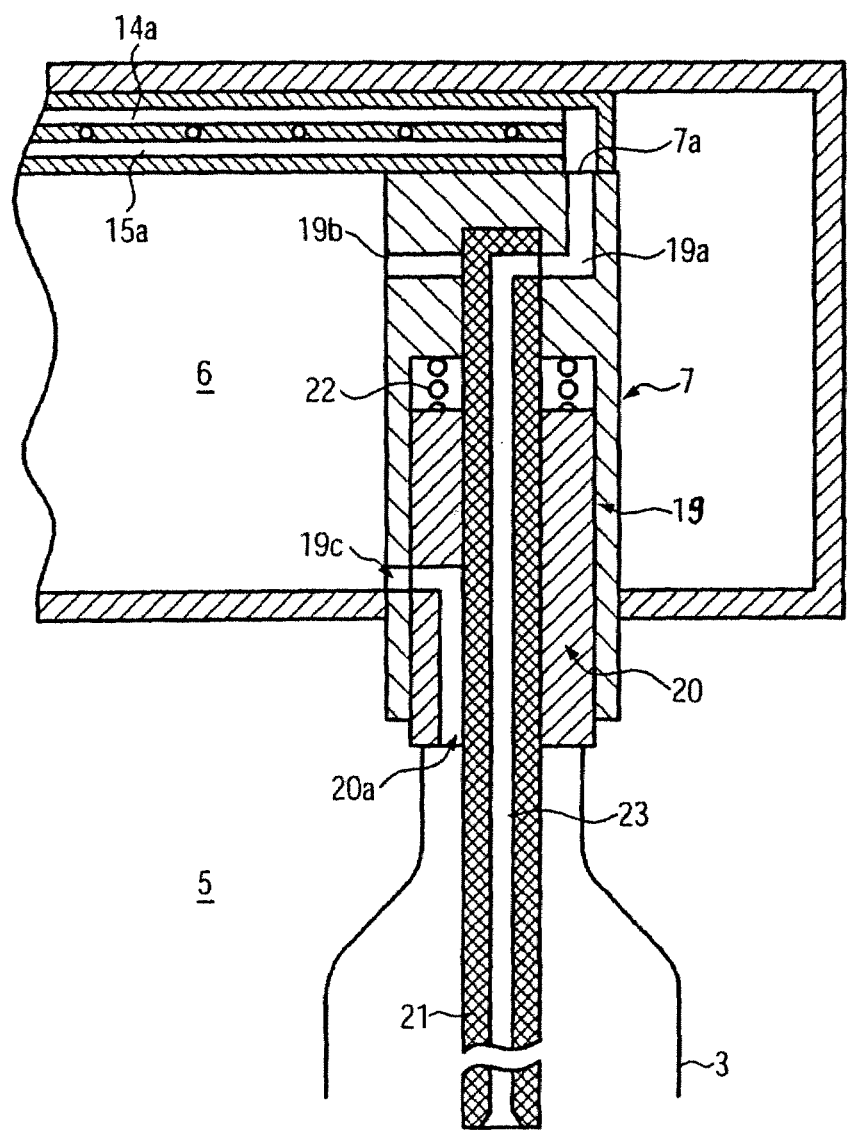
FIG. 3 shows a consumer station for introducing process medium.

Each of the pressure chambers 9a, 9b communicates via a respective line 14 and 15 with all consumer stations 2. The lines 14, 15 terminate in a connection 7a of the valve 7, without any additional process media valve being provided between the connections 7a and the respective pressure chambers 9a and 9b. Before the respective connection 7a of the valve 7 of each consumer station 2, the line 14, 15 is configured as a respective capillary path 14a and 15a (FIGS. 2 and 3). The capillary paths 14a, 15a are preferably configured as capillary tubes which consist of an appropriate plastic material. They can easily be produced with the desired dimensions. Both capillary paths 14a, 15a terminate jointly into the connection 7a.

The capillaries 14a, 15a are part of a unit generally designated by reference numeral 16 and used for keeping predetermined flow conditions constant, so as to accomplish and keep constant a predetermined flow rate which replaces the separate process media valves required at each consumer station in the prior art. In addition to the capillary paths 14a, 15a, which provide a defined flow cross-section that is as small as possible, a unit for keeping constant the flow velocity through the capillary paths 14a, 15a is additionally provided. Depending on the structural characteristics of the device 1, the unit 16 may, for example, comprise measures for keeping the temperature of the capillary paths 14a, 15a substantially constant and, where appropriate, also at a value that deviates from the ambient temperature. In the embodiment shown, the capillary paths 14a, 15a are accommodated in a heat store 17, which may e.g. be an aluminum block with sufficient heat storage mass. For increasing the temperature, the heat store 17 may contain a heating 18, e.g. a temperature controller and water as a heat carrier. Although this is not shown in the figures, the heat storage block 17 may be annular in shape and it may comprise a plurality of, preferably all of the capillary paths of all the consumer stations 2.

The unit 16 additionally provides a defined pressure drop in the lines 14, 15 between the respective reservoir 10, 11 and, as will be explained in more detail hereinbelow, the second pressure chamber 6. Since the second pressure chamber 6 has established therein a defined pressure, which allows the plasma to be ignited during plasma coating, and since this pressure is maintained, this may also be utilized for keeping the flow velocity constant within the capillary paths 14a, 15a in that the mass flow controller 12 and 13, respectively, is set to a predetermined constant flow. This has the effect that a certain media pressure will build up in the respective pressure chamber 9a, 9b, which is in equilibrium with the medium escaping through the capillary paths 14a, 15a and the medium supplied through the mass flow controller 12 and 13, respectively. In this way, the system is self-regulating and the process medium introduced in the pressure chamber 9a, 9b will be distributed uniformly to all the capillary paths 14a, 15a of all the connected consumer stations 2. It follows that the pressure chambers 9a, 9b act as a buffer.

In this way, it is guaranteed that the same predetermined amount of process medium will be supplied to all the consumer stations 2.

Another advantage of the use of the capillary paths 14a, 15a according to the present disclosure will be obtained when a process medium is used, which, though required in a gaseous state, can be handled and stored more effectively and more easily in a liquid state. The unit according to the present disclosure allows transmitting this process medium first in a liquid state through the respective capillary, and, when the process medium is discharged from the capillary into the vacuum (prevailing in the treatment chamber 6), it will evaporate and therefore be present in the container 3 in gaseous form.

The valve 7 includes a substantially cylindrical valve body 19 in the interior of which a plunger 20 is axially displaceable. A tube 21 is secured in position in said plunger 20 and is movable together therewith. This tube 21 may be implemented e.g. as a tubular microwave conductor or as a tubular electrode. The valve body 19 and the plunger 20 have provided between them a spring 22 whose bias force urges the plunger 20 towards the container 3 so as to close the opening of said container 3. The tube 21 has formed therein an intake passage 23 having an intake opening 23a through which the process medium can enter from the capillary paths 14a, 15a, and an outlet opening 23b through which the process medium will flow into the container 3.

The valve block 19 has formed therein an intake passage 19a which communicates with the connection 7a and which is arranged such that it is in alignment with the inlet 23a of the passage 23, when the plunger 20 occupies its uppermost position.

The valve body 19 has additionally formed therein a first discharge passage 19b and a second discharge passage 19c which both terminate into the treatment chamber 6. The first discharge passage 19b is implemented such that it is in alignment with the intake passage 19a for flow communication, when the tube 21 occupies the lowermost position, which is determined by the compression spring 22 (and possibly a stop). The second discharge passage 19c is adapted to be brought into alignment with an overflow passage 20a which is provided in the plunger 20 and which terminates into the container 3. When the second discharge passage 19c communicates with the overflow passage 20a, pressure compensation will take place between the process chamber 6 and the container 3.

FIG. 3 shows the position of the valve 7 at the beginning of a plasma coating process. As can be seen from the figure, the container 3 is pressed against the plunger 20 (e.g. by means of a cam follower), the container opening being sealed by a lower surface of the plunger 20 implemented as a sealing surface. The lifting movement is dimensioned such that the plunger 20 is forced into the valve body 19 where it compresses the spring 22, until the process chamber 6 and the interior of the container 3 communicate via the overflow passage 20a. Due to the vacuum in the process chamber 6, the container 3 is evacuated. At the same time, the tube 21 establishes a flow connection from the connection 7a via the intake passage 19a into the passage 23 and from there into the container 3, through which the process medium or the process media required for coating is/are introduced in the container 3. This is accomplished through the pressure difference between the evacuated interior of the container 3 and the pressure chamber 9a and 9b, respectively, whose pressure is, in turn, kept constant via the mass flow controllers 12 and 13 and the reservoirs 10 and 11 in a self-regulating manner. It follows that, when the container 3 is moved, via the cam follower, about the axis 4' by a predetermined length and at a predetermined speed, a predetermined amount of process medium which suffices to build the desired coating is transmitted into the container 3.

When the coating process has been finished, the container 3 is, preferably again by lowering the cam follower, moved downwards, with the plunger 20 still following in sealing contact with the opening of the container through the pressure applied by the spring 22. This has the effect that the supply via the connection 7a is interrupted and the overflow passage is separated from its connection with the process chamber 6 so that the pressure (vacuum) prevailing in the process chamber 6 will again be applied to the end of the capillary paths 14a, 15a via the passages 19b and 19a, and thus produce a defined pressure difference. This position is shown in FIG. 2. Subsequently, the container 3 can be removed from the carousel 4.

When the device 1 according to the present disclosure, which serves to supply consumer stations on a carousel, is used for plasma coating of containers (inner surface), a pressure at which plasma can ignite is established and maintained in process chamber 6, which can be connected to the interior of the container 3 via the passages 19c and 20a, whereas in process chamber 5, which communicates with the outer side of the container 3, a pressure can be established and maintained, at which an ignition of plasma is not possible. When the process is being executed, a pressure of 0.1 mbar should prevail in the interior of the container under a process gas load of approx. 50 sccm. The process media used are oxygen and hexamethyldisiloxane (HMDSO). The HMDSO is present in liquid form, whereas the oxygen is supplied in a gaseous state. In order to accomplish a gas flow of 50 sccm oxygen through the respective capillary path, a pressure difference of approx. 600 mbar is required. The pressure in the pressure chamber with the respective process medium (gas/liquid) is stabilized at 600 mbar relative to the end of the capillaries and, consequently, relative to the pressure in process chamber 6, so that a plurality of capillaries is supplied from this chamber in parallel.

The capillary paths for the gaseous oxygen preferably have a length of 600 mm and an inner diameter of 0.25 mm. The capillary paths for the liquid HMDSO preferably have a length of 1000 mm and an inner diameter of 0.10 mm. The temperature of the capillary paths is stabilized by connecting them to the heat store (heat bath), said heat store being heated to 60° C. and stabilized by the heating means (temperature controller and water as a heat carrier). The mass flow controllers are fed with the respective medium under a pressure of normally 2 bar. This course of action is adopted equally for liquid as well as for gaseous process media, the only difference being that the liquid process medium evaporates when it is discharged into the vacuum in the interior of the container 3 where it will then also be present in a gaseous form.

In a modified form of the embodiments described and shown hereinbefore, the present disclosure can also be used for other devices in the case of which a large number of consumers is to be supplied with identical, comparatively small amounts of a process medium. Constructing a carousel for a coating system is not critical either, so that the disclosure can be used in all coating systems.

We claim:

1. A device for supplying a large number of consumer stations with a predetermined amount of at least one process medium, in particular a coating device for containers, comprising:
   a supply line for supplying the respective process medium via a connection provided at each of the consumer stations;
   the supply line comprising a unit for keeping a predetermined flow rate of the respective process medium constant, the unit comprising a capillary path extending upstream of the associated connection and dimensioned in accordance with the predetermined amount of the process medium to provide a defined pressure drop in the supply line; and
   one or more valves and a pressure chamber connected in line and associated with a plurality of the connections in common, the one or more valves and the pressure chamber for maintaining a defined flow velocity of the respective process medium along the associated capillary paths, and the one or more valves such that when opened do not result in process media mixing at the pressure chamber.

2. A device according to claim 1, the capillary path comprises a capillary tube made of plastic material.

3. A device according to claim 1, wherein the capillary path has an inner diameter of about 0.25 mm and a length of about 100 mm.

4. A device according to one of the claim 1, wherein the capillary path is accommodated in a heat store.

5. A device according to claim 4, wherein a plurality of capillary paths is accommodated in the heat store.

6. A device according to claim 1, wherein the capillary path includes a heating means.

7. A device according to claim 1, wherein the pressure chamber, when seen in the direction of flow, is located before the capillary paths, and the device comprising a further pressure chamber which, when seen in the direction of flow, is located after the capillary paths.

8. A device according to claim 1, wherein the valve and the pressure chamber are implemented as a self-regulating unit.

9. A device according to claim 1, wherein the consumer station is arranged on a carousel and connected to a process media reservoir.

10. A device according to claim 1, wherein for supplying the consumer station with a plurality of process media, a unit for maintaining a predetermined flow rate constant is provided for each process medium, the unit comprising a capillary path extending before each connection and dimensioned in accordance with the predetermined amount of process medium, and further comprising, for each process medium, a valve and a pressure chamber which are associated with a plurality of the connections and which are used for maintaining a defined flow velocity along the associated capillary paths.

11. A device according to claim 10, wherein for supplying the consumer station with a gaseous process medium, the unit, which is used for keeping a predetermined flow rate constant, is adapted to the process medium in a liquid state and is implemented such that the process medium flowing through the associated capillary paths in a liquid state is evaporable upon discharge from said capillary paths.

* * * * *